(12) United States Patent
Woodfield et al.

(10) Patent No.: US 12,223,659 B1
(45) Date of Patent: Feb. 11, 2025

(54) TECHNIQUES FOR EXTRACTING AND DISPLAYING SUPERELEVATION DATA FROM 3D ROADWAY MODELS

(71) Applicant: Bentley Systems, Incorporated, Exton, PA (US)

(72) Inventors: Nicholas Woodfield, Watertown, CT (US); Alexandre Gagnon, Quebec (CA); Joey LouAllen, Huntsville, AL (US); Simon Normand, Quebec (CA)

(73) Assignee: Bentley Systems, Incorporated, Exton, PA (US)

( * ) Notice: Subject to any disclaimer, the term of this patent is extended or adjusted under 35 U.S.C. 154(b) by 445 days.

(21) Appl. No.: 17/687,097

(22) Filed: Mar. 4, 2022

(51) Int. Cl.
  *G06T 7/13* (2017.01)
  *G06T 17/20* (2006.01)
  *G06T 19/20* (2011.01)

(52) U.S. Cl.
  CPC .............. *G06T 7/13* (2017.01); *G06T 17/205* (2013.01); *G06T 19/20* (2013.01); *G06T 2219/2016* (2013.01)

(58) Field of Classification Search
  CPC ....... G06T 7/13; G06T 2200/04; G06T 19/20; G06T 2207/30236
  See application file for complete search history.

(56) References Cited

U.S. PATENT DOCUMENTS 8,190,401 B2 * 5/2012 Boucherat .............. G06F 30/13
                                                                        404/1
9,121,716 B2   9/2015 Denaro
                  (Continued)

FOREIGN PATENT DOCUMENTS

CN       113284245 A  *  8/2021  ............ G06T 17/10
WO    WO-2022056575 A1 *  3/2022

OTHER PUBLICATIONS

Vangari, "Why Superelevation should be provided on curves? A Civil3D's approach!"; Medium; https://medium.com/@nithishnetha/why-superelevation-should-be-provided-on-curves-a-civil3ds-approach-921d0857840e; (Year: 2020).*

(Continued)

*Primary Examiner* — Sumati Lefkowitz
*Assistant Examiner* — Michael Adam Shariff
(74) *Attorney, Agent, or Firm* — Cesari and McKenna, LLP; James A. Blanchette

(57) ABSTRACT

In example embodiments, a superelevation tool extracts and displays superelevation data from a 3D roadway model by accessing roadway meshes and a horizonal alignment from the 3D roadway model, extracting a plurality of template drops from the one or more roadway meshes at locations along the horizonal alignment to produce an ordered list of template drops and processing the template drops of the ordered list to identify top-facing roadway edges in each template drop that represent top pavement surface of the roadway at the location of the template drop, iteratively searching for a superelevation candidate and detecting superelevation data from the superelevation candidate at least in part by comparing cross-slopes of the top-facing roadway edges of consecutive template drops in the ordered list, wherein a superelevation candidate includes at least two or more template drops having cross-slopes that are locked, and providing a visualization of the detected superelevation data.

20 Claims, 8 Drawing Sheets

(56) References Cited

U.S. PATENT DOCUMENTS

| | | |
|---|---|---|
| 10,534,091 B2 | 1/2020 | Choi et al. |
| 2014/0229142 A1 | 8/2014 | Schrum, Jr. |
| 2022/0036069 A1* | 2/2022 | Bulan .................. G06T 7/0002 |

OTHER PUBLICATIONS

Abbasghorbani, Mojtaba, et al., "Evaluation of Horizontal Curve Superelevation Using Road Surface Profiler (RSP)," Chinese Society of Pavement Engineering, International Journal Pavement Research Technology, vol. 8, No. 3, May 2015, pp. 185-191.

Kim, Jin-Soo, et al., "Extraction of Geometric Information on Highway Using Terrestrial Laser Scanning Technology," The International Archives of the Photogrammetry, Remote Sensing and Spatial Information Sciences, XXIst ISPRS Congress, Technical Commission V, vol. XXXVII, Part B5, Beijing, China, Jul. 3-11, 2008, pp. 539-544.

Tsai, Yichang (James), Ph.D., P.E., et al., "An Automated Superelevation Measurement Method for Horizontal Curve Safety Assessment Using a Low-Cost Mobile Device," School of Civil and Environmental Engineering, Mar. 9, 2017, pp. 1-21.

Tsai, Yichang (James), et al., "Automated Superelevation Measurement Method Using a Low-Cost Mobile Device," Transportation Research Record: Journal of the Transportation Research Board, No. 2621, Sep. 2017, pp. 62-70.

Wang, Jin, et al., "Automatic Estimation of Road Slopes and Superelevations Using Point Clouds," American Society of Photogrammetry and Remote Sensing, Photogrammetric Engineering & Remote Sensing, vol. 83, No. 3, Mar. 2017, pp. 217-223.

\* cited by examiner

TECHNIQUES FOR EXTRACTING AND DISPLAYING SUPERELEVATION DATA FROM 3D ROADWAY MODELS

BACKGROUND

Technical Field

The present disclosure relates generally to infrastructure modeling, and more specifically to improved techniques for extracting and displaying superelevation data from three dimensional (3D) roadway models.

Background Information

In the design, construction and/or maintenance of infrastructure it is often desirable to create infrastructure models. An infrastructure model may be a built infrastructure model (BIM) or digital twin of infrastructure. A BIM is a digital representation of infrastructure as it should be built, providing a mechanism for visualization and collaboration. A digital twin is a digital representation of infrastructure as it is actually built, and is often synchronized with information representing current status, working conditions, position or other qualities. One type of infrastructure model is a three-dimensional (3D) roadway model. A 3D roadway model typically consists of a number polygon meshes (or simply a-"meshes"), including one or more roadway meshes representing the pavement surface of a roadway, and other meshes (e.g., a curb mesh, sidewalk mesh, an aggregate mesh, etc.) that represent other components of the roadway. The meshes are commonly arranged according to a horizonal (i.e. x-y plane) and vertical (i.e. z-axis) alignment.

Superelevation is a key criterion in roadway design. As used herein, "superelevation" refers to banking of a pavement surface that is intended to cancel out the effects of lateral forces when a vehicle is driving into a curve. By raising the outside edge of the roadway, superelevation may improve safety, comfort and optimal vehicle speed, counteracting tendencies for a vehicle to skid or tip. To achieve the best effect, superelevation generally should be applied gradually over a distance, such that roadway geometry changes slowly.

Multiple people (e.g., engineers) typically are tasked with checking superelevation at different times during design of a new roadway and/or the modification to an existing roadway, in a process commonly referred to as "superelevation validation." Superelevation validation ensures that various values are consistent with standards and best practices, and may include obtaining and validating the location of key stations (i.e., locations along the roadway where there are changes to banking of the pavement surface), cross-slopes (i.e. the transverse slope of the pavement surface with respect to the horizon, which typically changes at key stations) and transition lengths (i.e. the distance between key stations). These values may be collectively referred to as "superelevation data". By obtaining and validating superelevation data, safety, comfort, and optimal vehicle speed may be ensured by having smooth and predicable changes in the roadway geometry.

However, existing superelevation validation techniques commonly suffer from inefficiencies. In cases where the roadway is described in a 3D roadway model, superelevation validation traditionally involves a user (e.g., an engineer) manually cutting cross sections along the roadway at selected locations (e.g., selected stations) using design software, to produce two-dimensional (2D) drawings that illustrate the transverse geometry of the roadway. The user traditionally then manually analyzes and annotates these 2D drawings, taking dimensional measurements and adding them to the 2D drawings. Finally, the user may compare various 2D drawings at various ones of the locations (e.g., stations) to determine superelevation data, and compare them to standards and best practices.

There is a significant burden on the user throughout the process. The user typically must manually select the locations (e.g., stations), ensuring they capture where relevant transverse geometry is being exhibited. The user likewise typically must manually analyze and annotates the 2D drawings, and manually make relevant comparisons among 2D drawings. Should the 3D roadway model be updated or changed, these manual operations typically must be repeated. There is usually no way to extract superelevation data directly from the 3D roadway model directly, much less to extract and display it in an efficient, automated manner.

Accordingly, there is a need for improved techniques for extracting and displaying superelevation data from 3D roadway models.

SUMMARY

In example embodiments, a superelevation tool of a cloud-based design review service is provided for efficiently and automatically extracting and displaying superelevation data from 3D roadway models. The superelevation tool may implement a deterministic methodology to produce consistent results, without prior knowledge of design intent behind the 3D roadway model.

In one example embodiment, a superelevation tool of a cloud-based design review service extracts and displays superelevation data from a 3D roadway model by executing a sequence to steps. The superelevation tool may access one or more roadway meshes and a horizonal alignment from the 3D roadway model. The superelevation tool may extract a plurality of template drops from the one or more roadway meshes at locations along the horizonal alignment to produce an ordered list of template drops and process the template drops of the ordered list to identify top-facing roadway edges in each template drop that represent top pavement surface of the roadway at the location of the template drop. The superelevation tool may iteratively search for a superelevation candidate and detect superelevation data from the superelevation candidate at least in part by comparing cross-slopes of the top-facing roadway edges of consecutive template drops in the ordered list, wherein a superelevation candidate includes at least two or more template drops having cross-slopes that are locked. The superelevation tool may then provide a visualization of the detected superelevation data.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION

Figure 1:
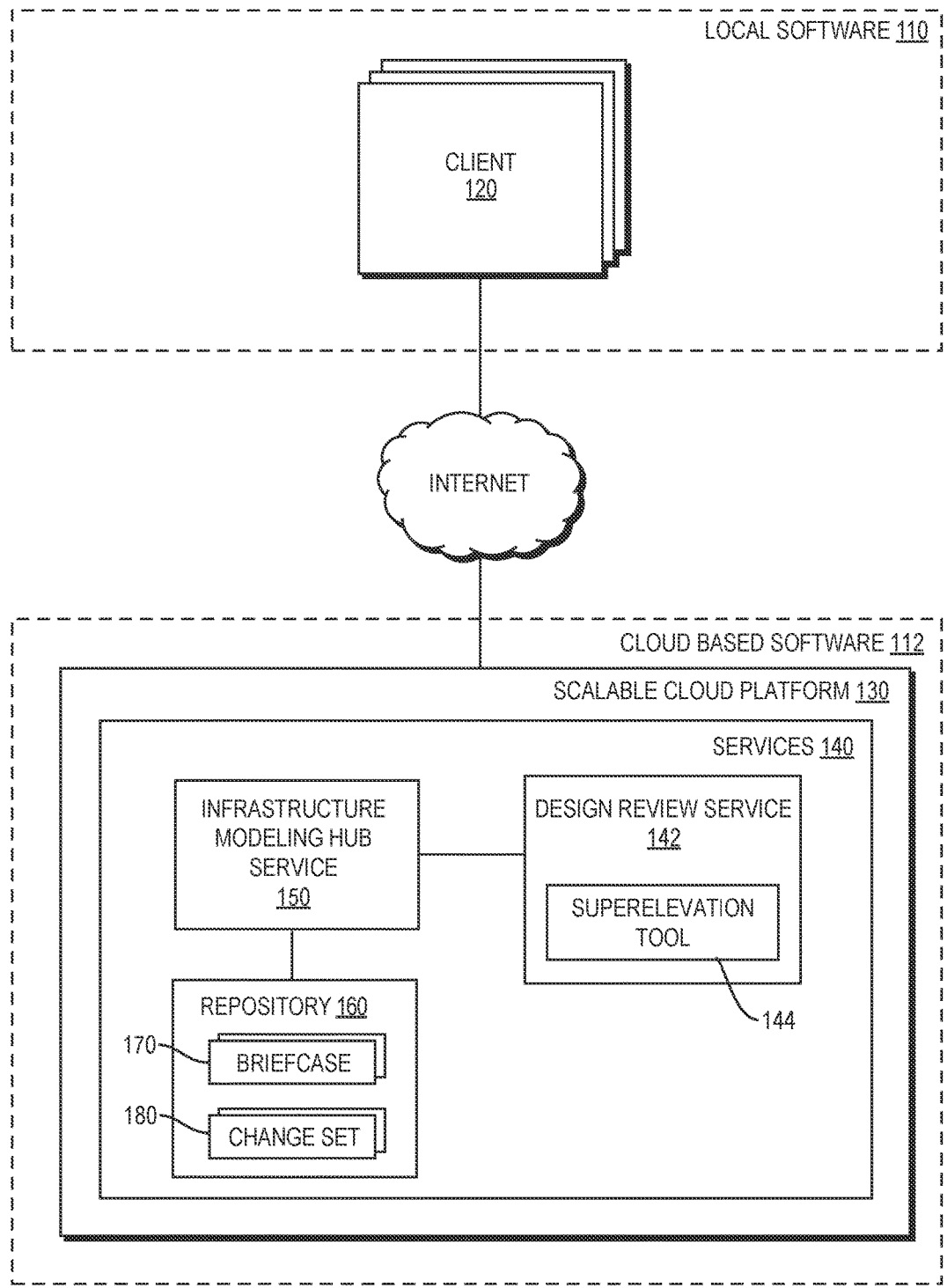
FIG. 1 is a high-level block diagram of an example software architecture in which improved techniques for extracting and displaying superelevation data from 3D roadway models may be implemented.

FIG. 1 is a high-level block diagram of an example software architecture in which improved techniques for extracting and displaying superelevation data from 3D roadway models may be implemented. The architecture may be divided into client-side software 110 executing on one or more computing devices arranged locally (collectively "client devices") and cloud-based services software 112 executing on one or more remote computing devices ("cloud computing devices") accessible over the Internet. Each computing device may include processors, memory/storage, a display screen, and/or other hardware (not shown) for executing software, storing data and/or displaying information. The client-side software 110 may include client software (or simply "clients") 120 operated by users. The clients 120 may be of various types, including desktop clients that operate directly under an operating system of a client device and web-based clients that operate within a web browser. The clients 120 may be concerned mainly with providing user interfaces and interacting with the application program interfaces (APIs) of cloud-based services that perform more computing resource intensive tasks.

The cloud-based software 112 may include a scalable cloud platform (e.g., an iTwin® platform) 130 that provides APIs and libraries to support cloud based software services (or simply "services") 140 that interact with the clients 120 to enable users to create, modify, view, analyze, simulate and/or otherwise interact with infrastructure models (e.g., iModel® models), including 3D roadway models. Such 3D roadway models may consist of a number of meshes, including a roadway mesh representing the pavement surface of the road, and other meshes (e.g., a curb mesh, sidewalk mesh, aggregate mesh, etc.) that represent other components of the roadway.

The scalable cloud platform (e.g., iTwin® platform) 130 may include an infrastructure modeling hub service (e.g., an iModelHub™ service) 150 that functions as a control center for infrastructure models (including 3D roadway models), coordinating concurrent access and changes resulting in different versions. To accomplish this, the infrastructure modeling hub service 150 may maintain briefcases 170 and a set of accepted changesets 180 in a repository 160-164. When services 140/clients 120 desire to operate upon an infrastructure model they may obtain a briefcase 170 from a repository 160-164 closest to the desired state, and those accepted changesets 170 from the repository 160-164 that when applied bring that briefcase up to the desired state. When services 140/clients 120 make a change, they may create a local changeset that represents pending changes. Subsequently, the local changeset may be pushed back to the infrastructure model hub services 150 to be added to the set of accepted changesets 180.

The services 140 may include a design review service (e.g., an iTwin Design Review™ design review and project coordination service) 142. The design review service 142 may include software tools (or simply "tools") for discipline-specific reviews of infrastructure models (including 3D roadway models), permitting efficient coordination of trades and authorization of data for release. In an application tailored for roadway design, construction and/or maintenance, the design review service 142 may include discipline-specific tools for extracting and displaying on a client 120 roadway data from a 3D roadway model, including a superelevation tool 144 for extracting and displaying superelevation data.

Figure 2:
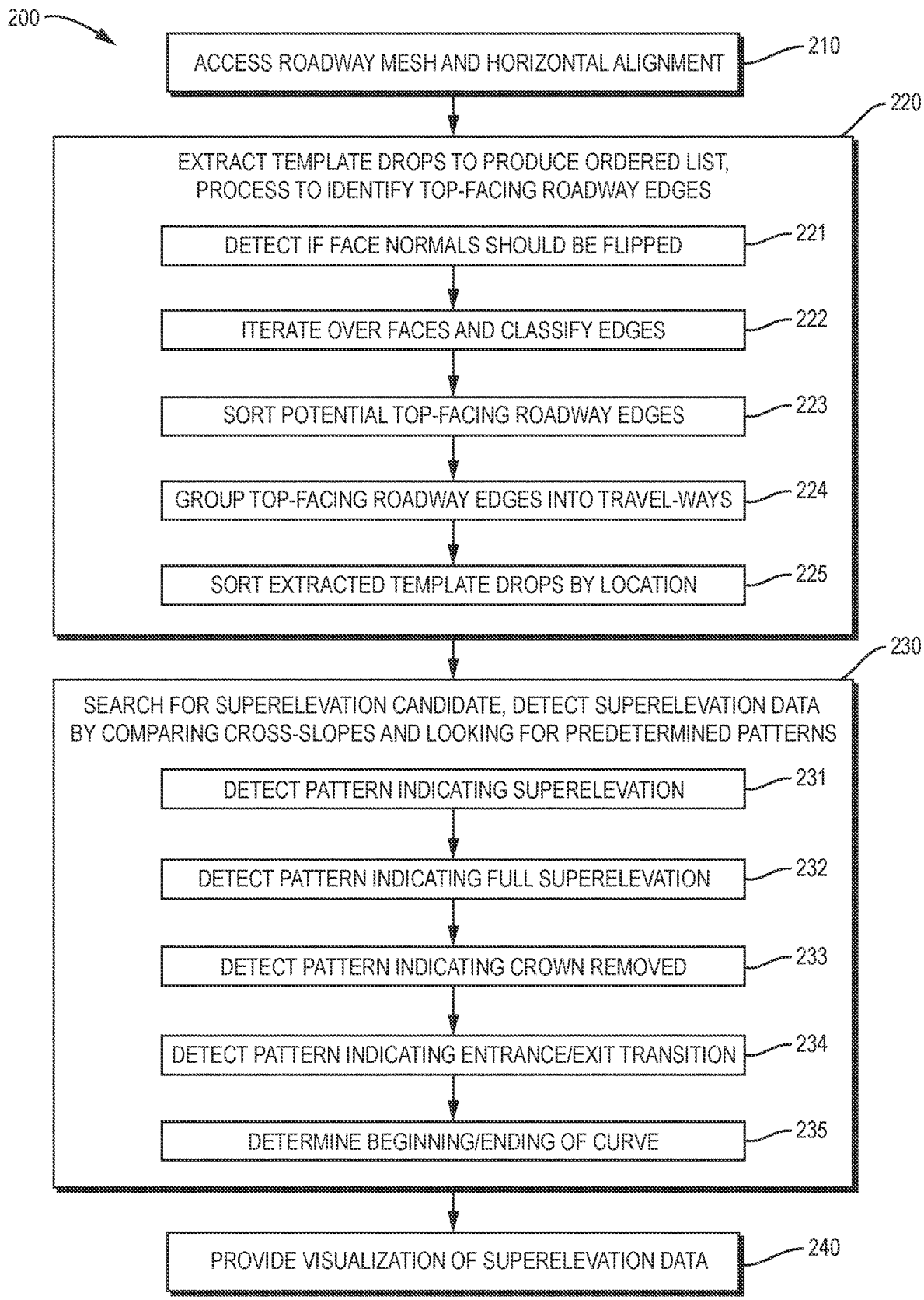
FIG. 2 is a flow diagram of an example sequence of steps that may be executed by a superelevation tool of a design review service for extracting and displaying superelevation data from a 3D roadway model.

FIG. 2 is a flow diagram of an example sequence of steps 200 that may be executed by a superelevation tool 144 of a design review service 142 for extracting and displaying superelevation data from a 3D roadway model. The sequence of steps 200 may be triggered in response to user input in the user interface of a client 120 in communication with the superelevation tool 144 of the design review service 142.

As discussed above, the 3D roadway model may consist of a number meshes, including one or more roadway meshes representing the pavement surface of the roadway and other meshes that represent other components of the roadway. The meshes are commonly arranged according to a horizonal (i.e. x-y plane) and vertical (i.e. z-axis) alignment. At step 210, the superelevation tool 144 may access the one or more roadway meshes and the horizonal alignment. The superelevation tool 144 may also access a number of parameters, that may be configured (e.g., in response to user input on a client 120) for a particular superelevation extraction task or have default values. The parameters may include a discard bottom-face normal angle threshold, a dot product tolerance threshold, a cross-slope lock tolerance threshold, and a maximum gap threshold, among other thresholds.

At step 220, the superelevation tool 144 may extract a plurality of template drops from the one or more roadway meshes at locations along the horizonal alignment to produce an ordered list of template drops, and process the template drops of the ordered list to identify top-facing roadway edges in each template drop that represent top pavement surface of the roadway at the location of the template drop. As used herein, the term "template drops" refers to cross-sectional templates cut ("dropped") at locations (e.g., stations) along a horizonal alignment of a roadway that describe the anatomy of the roadway (e.g., the pavement, curbs, sidewalks, aggregate, etc.). A template drop may be extracted by determining edges of polygons of the roadway mesh at the location that are perpendicular to the horizontal alignment, and then processing and sorting those edges.

Figure 3:
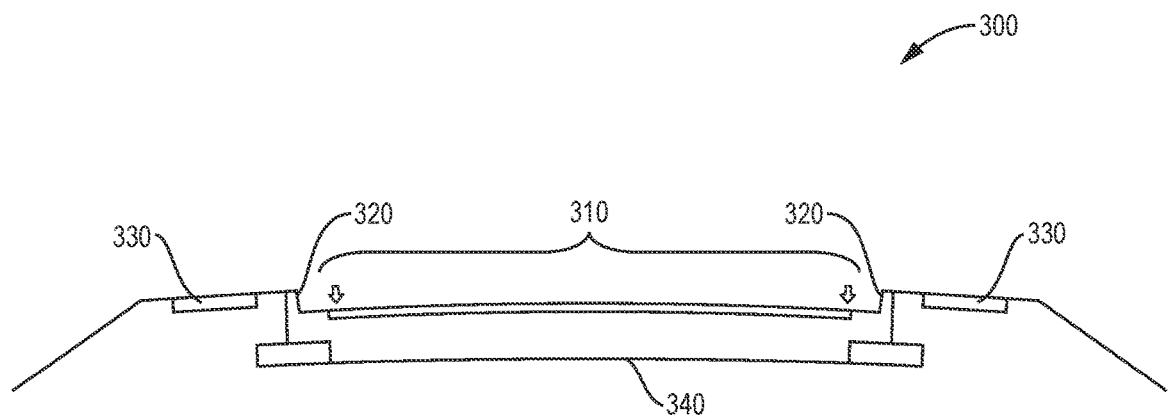
FIG. 3 is a diagram of an example template drop that may be extracted.

FIG. 3 is a diagram of an example template drop 300 that may be extracted as part of sub-step 221. The template drop includes top-facing roadway edges 310 that represent the top-facing pavement surface of the road, as well as additional edges 320, 330, 340 that represent curbs, sidewalks, and bottom-facing and side-facing surfaces of the pavement.

The top-facing roadway edges 310 are the edges that are of primary concern in relation to the techniques described herein.

Step 220 may be broken down into a number of sub-steps that perform individual processing and sorting tasks. At sub-step 221, at each location (e.g., station), the superelevation tool 144 may detect if face normal vectors of the roadway mesh should be flipped (i.e. inverted). The roadway mesh of the 3D roadway model may be composed of faces (e.g., triangles) each having a normal vector indicating the direction the face is oriented. These faces may be arranged into closed shapes that represent the pavement and other components of the roadway anatomy (e.g., curbs, sidewalks, aggregate, etc.). One problem is that the roadway mesh may have inconsistent windings (e.g., all the faces of the roadway mesh may have normal vectors pointing inward where a convention may be for normal vectors to be pointed outward). In this sub-step, a check is performed for inconsistent windings and, if detected, the direction of face normal vectors is flipped (inverted).

At sub-step 222, at each location (e.g., station) the superelevation tool 144 may iterate over every face of the roadway mesh and classify its edges. As part of sub-step 222, the superelevation tool 144 may discard bottom-facing faces that would not contribute any top-facing roadway edges. This may be performed by comparing face normal vectors to upright, and determining if the angle therebetween exceeds the discard bottom-face normal angle threshold. In one implementation, the discard bottom-face normal angle threshold may be set by default to 90°. Of the remaining faces, the superelevation tool 144 may determine if any have edges that are substantially perpendicular to the horizontal alignment. This may be performed by finding a closest point on the horizontal alignment and testing if a dot product between the edge and the horizontal alignment is tangent within the dot product tolerance threshold. In one implementation, the dot product tolerance threshold may be set by default to 0.001. The remaining substantially perpendicular edges are then listed as potential top-facing roadway edges for the location (e.g., station).

At sub-step 223, at each location (e.g., station) the superelevation tool 144 may sort the potential top-facing roadway edges using the closet point on the horizonal alignment as a reference point to produce top-facing roadway edges of the template drop. As part of sub-step 223, the superelevation tool 144 may discard duplicate edges by detecting edges that overlap. The superelevation tool 144 may further normalize edge start and stop points to be specified in a predetermined direction (e.g., always left-to-right). The superelevation tool 144 may further sort edges in an order according to predetermined directions (e.g., left-to-right and top-to-bottom).

Figure 4:
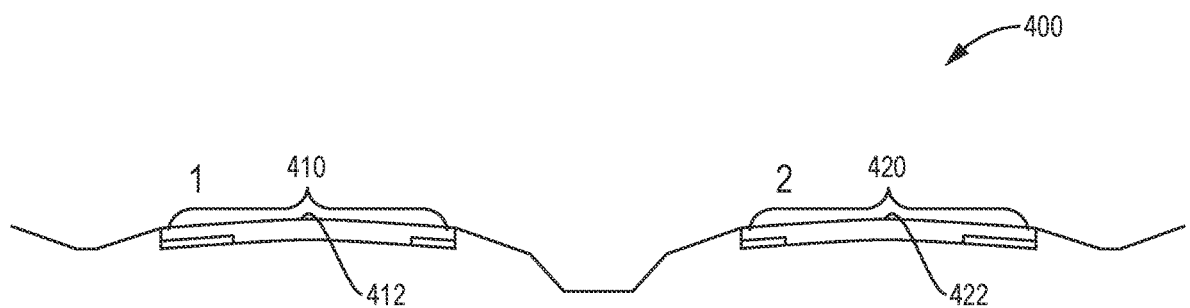
FIG. 4 is a diagram of an example template drop having two travel-ways whose top-facing roadway edges may be grouped into two disjoint groups.

At sub-step 224, the superelevation tool 144 may group top-facing roadway edges of each template drop into disjoint groups that correspond to travel-ways. As used herein, a "travel-way" refers to a collection of one or more lanes of a roadway that are group together. The lanes of a travel-way may be designed for a same vehicular traffic direction (e.g., as in a divided highway), or designated for travel in opposing directions. As part of sub-step 224, the superelevation tool 144 may cluster top-facing roadway edges into groups by determining if their proximity is less than the maximum gap threshold. In one implementation, the maximum gap threshold may be set by default to 0.3 meters (m). The superelevation tool 144 may find a high point of each group, and classify top-facing roadway edges as being to a left-side or right-side of the high point. The superelevation tool 144 may also sort groups relative to the closest point on the horizonal alignment that is used as a reference point FIG. 4 is a diagram of an example template drop 400 having two travel-ways whose top-facing roadway edges 410, 420 may be grouped into two disjoint groups as part of sub-step 224. Each of the two groups may have a high point 412, 422 around which the top-facing roadway edges may be classified.

Figure 5:
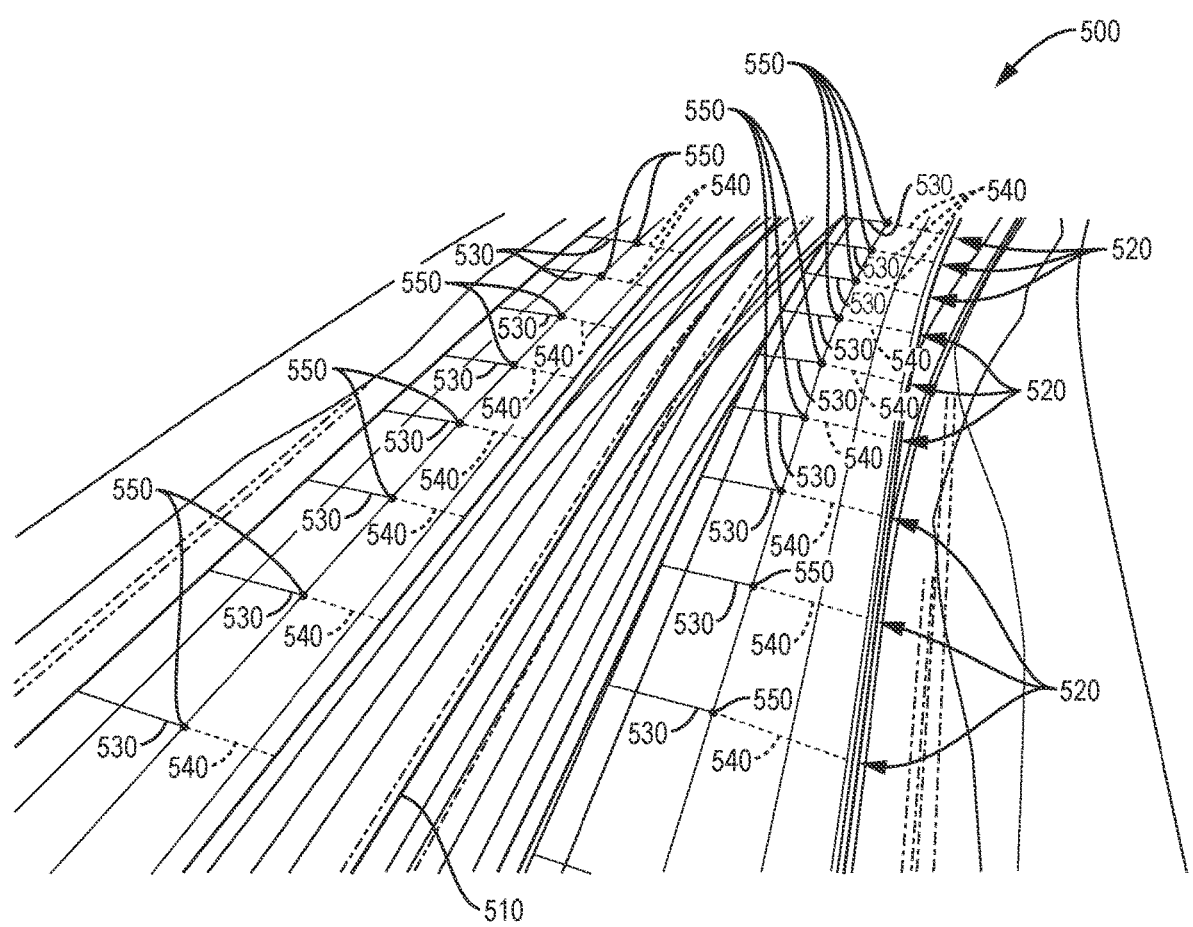
FIG. 5 is an example 3D model of an roadway showing ordered template drops along an alignment.

At sub-step 225, the superelevation tool 144 may sort extracted template drops by their location (e.g., station) along the horizontal alignment to produce an ordered list of template drops. Each template drop at this point includes travel-way grouped top-facing roadway edges classified based on the side (e.g., left or right) of the travel-way high point. FIG. 5 is an example 3D model 500 of an roadway showing ordered template drops along an alignment 510. The template drops are arranged at location 520 and extend across the roadway which is divided into two travel-ways. Top-facing roadway edges are grouped into the two travel-ways, and sorted into left and right side 530, 540 (here corresponding to left and right lanes) of high point 550 (here corresponding to a center of the travel-way).

At step 230, the superelevation tool 144 may iteratively search for a superelevation candidate, and detect superelevation data from the superelevation candidate, at least in part by comparing cross-slopes of the top-facing roadway edges of consecutive template drops in the ordered list and looking for one or more predetermined patterns. For roadways with multiple travel-ways, the searching may be performed separately for each travel-way, comparing cross-slopes of the top-facing roadway edges of the group corresponding to the same travel-way. The predetermined patterns may include a pattern where two or more consecutive template drops have cross-slopes that are locked, which typically indicates the roadway/travel-way is in superelevation. As used herein, the term "cross-slope" refers to a slope measured across the width of a roadway or travel-way (i.e. perpendicular to the horizontal alignment). As used herein, the term "locked" (in reference to a cross-slope) refers to a situation where substantially all (e.g., all relevant) portions of the cross-slope having a substantially same (e.g., equal) non-zero value.

The predetermined patterns may include additionally, or alternatively, patterns that indicate aspects of entrance or exit transitions for the superelevation. The predetermined patterns may indicate features, such as where the crown has been removed, where an entrance/exit transition begins/ends, and/or where there is reverse crown, as discussed in more detail below.

Figure 6:
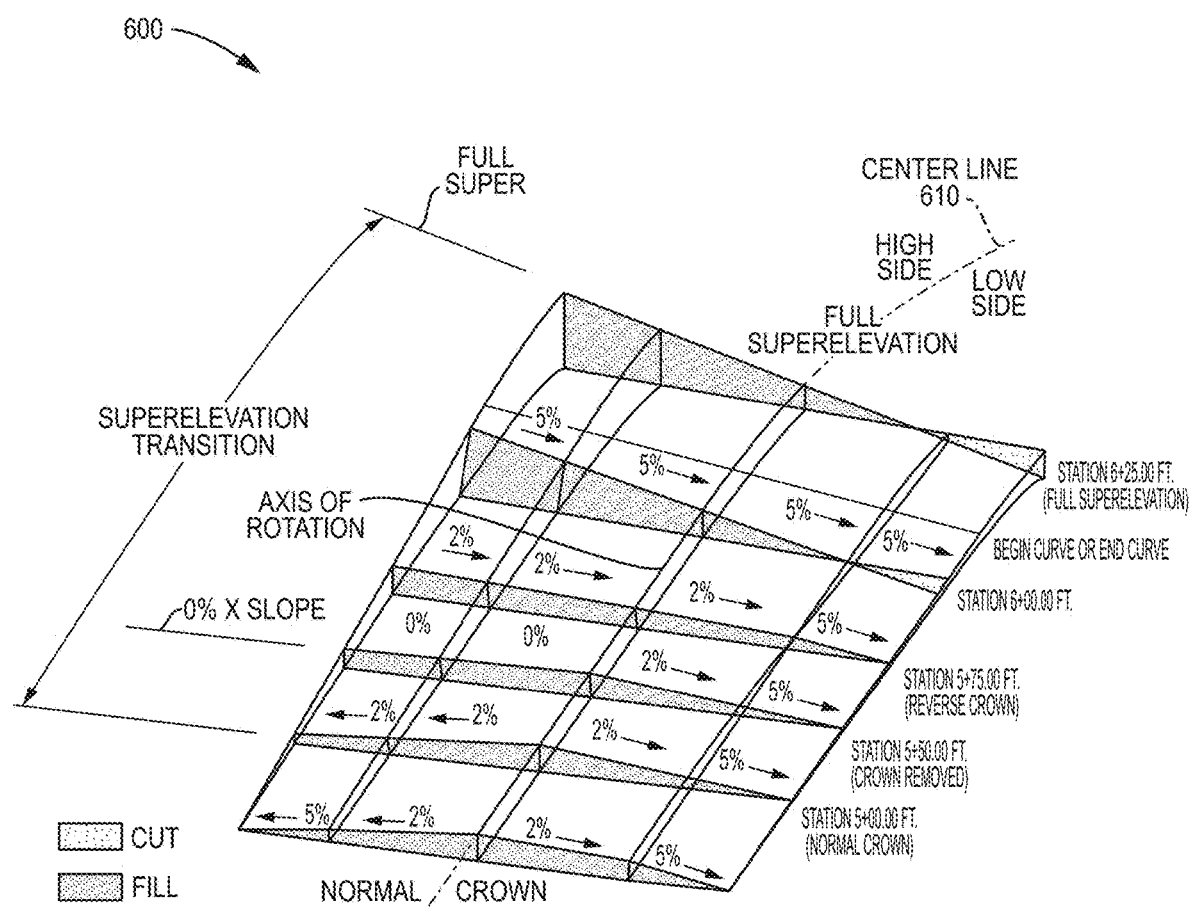
FIG. 6 is a diagram of an example roadway transitioning from normal crown to superelevation.

FIG. 6 is a diagram 600 of an example roadway transitioning from normal crown to superelevation, which may assist in understanding the one or more predetermined patterns the superelevation tool 144 looks for as part of step 530. Initially (at station 5+00 ft.) the example roadway is at normal crown, having 2% cross-slope in the lanes and 5% in the shoulder at on either side of the center line 610. When in full superelevation (at station 6+25 ft.), the roadway has cross-slopes for the lanes and shoulder that are locked at 5% towards the inside of the curve. In-between the normal crown and full superelevation there is a superelevation transition that includes a crown removed stage and a reverse crown stage. In the crown removed stage (at station 5+50 ft.), the example roadway has 0% cross-slope to one side of the center line 610 and 2% cross-slope in the lane and 5% in the shoulder to the other side. In the reverse crown stage (at station 5+75 ft.), the example roadway has a 2% cross-slope of everything to one side of the center line 610 and the lane to the other side, but has a shoulder with a 5% cross-slope.

Step 230 may be broken down into a number of sub-steps that perform individual searching and pattern matching tasks. At sub-step 231, the superelevation tool 144 may detect a pattern indicating superelevation. To do so the superelevation tool 144 may look for cross-slopes of the top-facing roadway edges of two or more consecutive template drops that are locked. To determine the cross-slopes of the top-facing roadway edges are locked, the superelevation tool 144 may determine whether their non-zero value differs from each other by more than the cross-slope lock tolerance threshold. In one implementation, the cross-slope lock tolerance threshold may be set by default to 0.009%. The range of consecutive template drops having such property may coincide with the start and stop points of superelevation.

Figure 7:
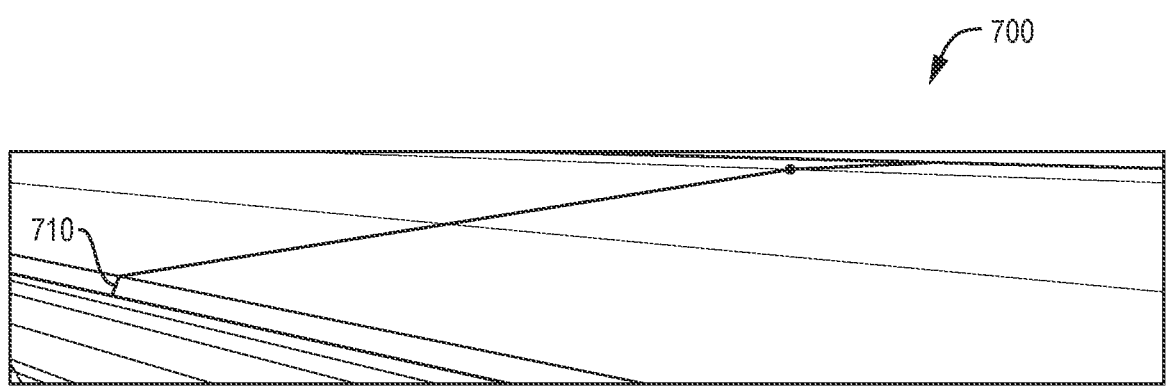
FIG. 7 is a diagram of example roadway including a small edge (tail) near the side of the pavement.

In some cases, the top-facing roadway edges may include small edges (sometimes referred to as "tails") near the side of the pavement that have different slopes than the rest of the pavement surface. These tails may be created during pavement mesh construction. FIG. 7 is a diagram 700 of example roadway including a small edge (tail) 710 near the side of the pavement. If such small edges (tails) were considered, it could disrupt the detection of superelevation. To prevent this, as part of sub-step 231, the superelevation tool 144 may disregard as irrelevant any top-facing roadway edges smaller than a predetermined threshold or with slopes greater than a predetermined threshold of (e.g., ~15%).

Within the range of consecutive template drops having cross-slopes that are locked, the cross-slope values may rise and fall from template drop to template drop (i.e. two consecutive template drops may have cross-slopes locked at different values). Such rising and falling may coincide with transitioning between a lesser amount of superelevation and full superelevation (i.e. the maximum banking of the pavement surface for a given curve).

At sub-step 232, the superelevation tool 144 may detect a pattern indicating full superelevation. To do so the superelevation tool 144 may first detect any subrange of two or more template drops within the range that each have the same cross-slope value. The superelevation tool 144 may then determine the subrange having the maximum cross-slope value and conclude this subrange corresponds to full superelevation.

While the most common superelevation scenario has cross-slope ascend to a maximum, hold for a time, and then descend (completing a full entrance and exit transition from superelevation), there may be scenarios where a roadway does not transition back to normal crown before entering another superelevation. To deal with these scenarios, the superelevation tool 144 may individually look for patterns that indicate where the crown has been removed, where an entrance/exit transition begins/ends, and/or where there is reverse crown, to determine if these features are present, and, if so, where they occur.

At sub-step 233, the superelevation tool 144 may look for a pattern indicating the crown has been removed before or after a superelevation. To do so, the superelevation tool 144 may iterate through template drops before and after the superelevation range in the ordered list and look for any template drop in which the cross-slope of least a portion of the top-facing roadway edges has a value of zero (0%). Such a template drop may be considered to have crown removed.

At sub-step 234, if there is a crown removed, the superelevation tool 144 may look for a pattern indicating where the entrance/exit transition begins/ends on either side of the superelevation. To do so the superelevation tool 144 may iterate through template drops of the ordered list before/after the identified crown removed, and look for a nearest template drop in which the cross-slope to either side of the high point has the same absolute value but is oppositely signed. Such a template drop may be considered to be where an entrance/exit transition begins/ends for the superelevation.

At sub-step 234, if an entrance/exit transition has been found, the superelevation tool 144 may look for a pattern indicating there is a reverse crown. To do so the superelevation tool 144 may determine a centerline of the roadway/travel-way by setting a line passing through the high point of the template drop at normal crown and parallel to the horizontal alignment, and looking for a template drop in which the cross-slope to either side of the centerline has the same absolute value and is same signed.

At sub-step 235, the superelevation tool 144 may also determine a beginning/ending of the curve in the roadway for which the superelevation is provided. To do so, the superelevation tool 144 may examine underlying primitives in the horizontal alignment, between the locations (e.g., stations) of the superelevation candidate.

Figure 8A:
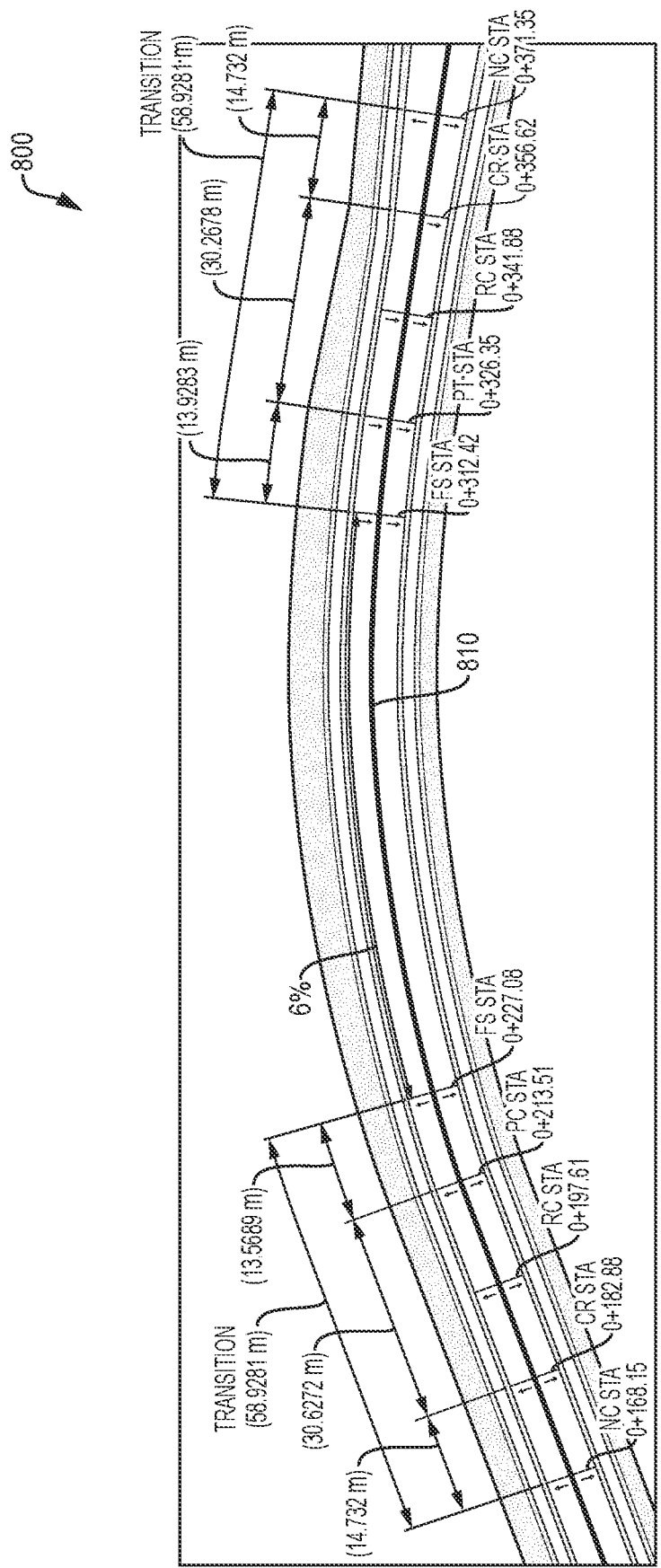
FIG. 8A is a screen shot of an example graphical visualization of superelevation data.
Figure 8B:
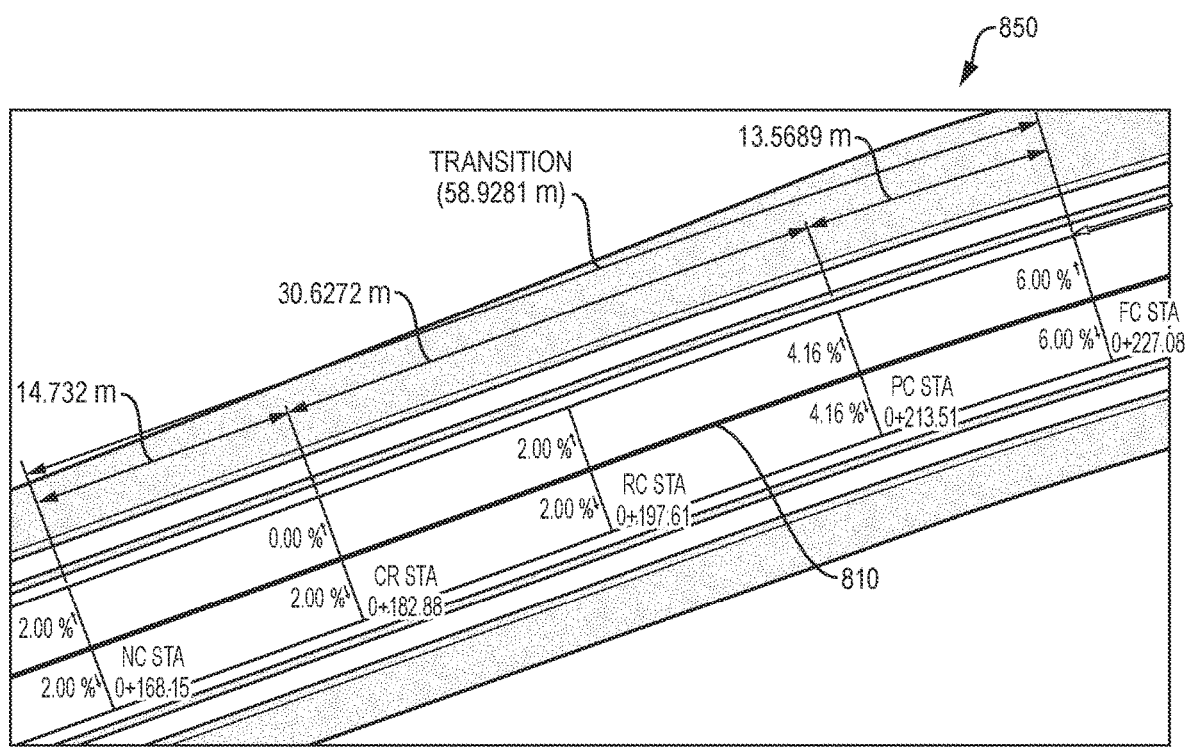
FIG. 8B is a screen shot of an example enlarged graphical visualization of superelevation data.

At step 240, the superelevation tool 144 may provide a visualization or other output of the detected superelevation data, which may be displayed in the user interface of a client 120 or otherwise utilized. The visualization may be a graphical visualization, in which a view of the 3D roadway model is shown and detected superelevation data is labeled on such view. FIG. 8A is a screen shot of an example graphical visualization of superelevation data. A line 810 may indicate the horizonal alignment of the roadway. The roadway itself may be coded with colors, patterns, or other indica to graphically indicate where the road is in normal crown, or is in a transition entering or exiting a superelevation, or is in full superelevation. Labels may be provided to indicate superelevation data, including locations where there is normal crown (NC), crown removed (CR), reverse crown (RC), full superelevation (FS) and the beginning (PC) and the ending (PT) of a curve. FIG. 8B is a screen shot of an example enlarged graphical visualization of superelevation data. In this close up, in addition to the superelevation data shown in FIG. 8A, arrows may be provided to show cross-slope directions and additional labels may be provided to show numeric cross-slope values.

It should be understood that various adaptations and modifications may be readily made to what is described above to suit various implementations and environments. While it is discussed above that many aspects of the techniques may be implemented by specific software modules executing on hardware, it should be understood that some or all of the techniques may also be implemented by different software on different hardware. In addition to general-purpose computing devices, the hardware may include specially configured logic circuits and/or other types of hardware components. Above all, it should be understood that the above descriptions are meant to be taken only by way of example.

What is claimed is:

1. A method for extracting and displaying superelevation data from a three dimensional (3D) roadway model, comprising:

accessing, by a superelevation tool executing on one or more computing devices, one or more roadway meshes and a horizontal alignment from the 3D roadway model;

extracting, by the superelevation tool, a plurality of template drops from the one or more roadway meshes at locations along the horizontal alignment to produce an ordered list of template drops, wherein the extracting determines edges of polygons of the one or more roadway meshes at each location that are perpendicular to the horizontal alignment and includes the determined edges in a respective template drop of the ordered list;

processing, by the superelevation tool, the template drops of the ordered list to identify top-facing roadway edges in each template drop that represent top pavement surface of the roadway at the location of the template drop;

iteratively searching, by the superelevation tool, for a superelevation candidate and detecting superelevation data from the superelevation candidate at least in part by comparing cross-slopes of the top-facing roadway edges of consecutive template drops in the ordered list and looking for one or more predetermined patterns; and providing a visualization of the detected superelevation data.

2. The method of claim 1, wherein the extracting further comprises:

grouping top-facing roadway edges of each template drop into disjoint groups that correspond to travel-ways, wherein the iteratively searching is performed separately for each group of top-facing roadway edges corresponding to a same travel-way.

3. The method of claim 1, wherein the extracting further comprises:

detecting that face normal vectors of the one or more roadway meshes should be flipped to be consistent with a convention; and in response to the detecting, changing the direction of the face normal vectors.

4. The method of claim 1, wherein the extracting further comprises:

iterating over faces of the one or more roadway meshes and classifying edges to identify top-facing roadway edges.

5. The method of claim 4, wherein the iterating and classifying further comprises, for each location:

discarding bottom-facing faces that do not contribute any top-facing roadway edges;

for any remaining faces, determining edges that are substantially perpendicular to the horizontal alignment; and listing the edges that are substantially perpendicular to the horizontal alignment as potential top-facing roadway edges.

6. The method of claim 4, further comprising, for each location:

sorting the potential top-facing roadway edges; and processing the sorted potential top-facing roadway edges to at least one of discard duplicate edges or normalize edge start and stop points to produce the top-facing roadway edges.

7. The method of claim 1, further comprising:

sorting extracted template drops by location along the horizontal alignment to produce the ordered list of template drops.

8. The method of claim 1, wherein the iteratively searching includes detecting a pattern indicating superelevation from among the one or more predetermined patterns, wherein the pattern includes top-facing roadway edges of two or more consecutive template drops being locked.

9. The method of claim 1, wherein the iteratively searching includes detecting a pattern indicating a crown has been removed, wherein the pattern includes cross-slope of least a portion of the top-facing roadway edges of a template drop having a value of zero.

10. The method of claim 1, wherein the iteratively searching includes detecting a pattern indicating an entrance/exit transition begins/ends, wherein the pattern includes cross-slope to either side of a high point having a same absolute value but being oppositely signed.

11. The method of claim 1, wherein the iteratively searching includes detecting a pattern indicating a reverse crown, wherein the pattern includes cross-slope to either side of a centerline having a same absolute value and being same signed.

12. A method for extracting and displaying superelevation data from a three dimensional (3D) roadway model, comprising:

accessing, by software executing on one or more computing devices, one or more roadway meshes and a horizontal alignment from the 3D roadway model;

extracting, by the software, a plurality of template drops from the one or more roadway meshes at locations along the horizontal alignment to produce an ordered list of template drops, wherein the extracting determines edges of polygons of the one or more roadway meshes at each location that are perpendicular to the horizontal alignment and includes the determined edges in a respective template drop of the ordered list;

processing, by the software, the template drops of the ordered list to identify top-facing roadway edges in each template drop that represent top pavement surface of the roadway at the location of the template drop;

iteratively searching, by the software, for a superelevation candidate and detecting superelevation data from the superelevation candidate at least in part by comparing cross-slopes of the top-facing roadway edges of consecutive template drops in the ordered list, wherein a superelevation candidate includes at least two or more template drops having cross-slopes that are locked; and providing the detected superelevation data.

13. The method of claim 12, wherein the extracting further comprises:

grouping top-facing roadway edges of each template drop into disjoint groups that correspond to travel-ways, wherein the iteratively searching is performed separately for each group of top-facing roadway edges corresponding to a same travel-way.

14. A non-transitory computing device readable medium having instructions stored thereon, the instructions when executed by one or more computing devices operable to:

access one or more roadway meshes and a horizontal alignment from the 3D roadway model;

extract a plurality of template drops from the one or more roadway meshes at locations along the horizontal alignment, the extraction to determine edges of polygons of the one or more roadway meshes at each location that are perpendicular to the horizontal alignment and include the determined edges in a respective template drop;

process the template drops to identify top-facing roadway edges in each template drop that represent top pavement surface of the roadway at the location of the template drop;

iteratively search for a superelevation candidate and detect superelevation data from the superelevation candidate at least in part by comparing cross-slopes of the top-facing roadway edges of template drops in the ordered list and looking for one or more predetermined patterns, wherein the one or more predetermined patterns include having cross-slopes that are locked; and providing a visualization of the detected superelevation data.

15. The non-transitory computing device readable medium of claim 14, wherein the instructions when executed are further operable to:

group top-facing roadway edges of each template drop into disjoint groups that correspond to travel-ways, wherein the instructions operable to iteratively search are operable to iteratively search separately for each group of top-facing roadway edges corresponding to a same travel-way.

16. The non-transitory computing device readable medium of claim 14, wherein the instructions when executed are further operable to:

iterate over faces of the one or more roadway meshes and classify edges to identify top-facing roadway edges by discarding bottom-facing faces that do not contribute top-facing roadway edges, for any remaining faces, determining edges that are substantially perpendicular to the horizontal alignment, and listing the edges that are substantially perpendicular to the horizonal alignment as potential top-facing roadway edges.

17. The non-transitory computing device readable medium of claim 16, wherein the instructions when executed are further operable to:

sort the potential top-facing roadway edges; and process the sorted potential top-facing roadway edges to at least one of discard duplicate edges or normalize edge start and stop points to produce the top-facing roadway edges.

18. The non-transitory computing device readable medium of claim 14, wherein the instructions when executed are further operable to:

sort extracted template drops by location along the horizonal alignment to produce an ordered list of template drops.

19. The non-transitory computing device readable medium of claim 14, wherein the one or more predetermined patterns further include a pattern indicating a crown has been removed or a pattern indicating a reverse crown.

20. The non-transitory computing device readable medium of claim 14, wherein the one or more predetermined patterns further include a pattern indicating an entrance/exit transition begins/ends.

* * * * *